United States Patent
Xia

(10) Patent No.: US 7,844,887 B2
(45) Date of Patent: Nov. 30, 2010

(54) BIT ERROR PROBABILITY ESTIMATION METHOD AND RECEIVER EMPLYING THE SAME

(75) Inventor: Yuan Xia, Taipei (TW)

(73) Assignee: Via Technologies, Inc., Hsin-Tien, Taipei (TW)

(*) Notice: Subject to any disclaimer, the term of this patent is extended or adjusted under 35 U.S.C. 154(b) by 1033 days.

(21) Appl. No.: 11/565,760

(22) Filed: Dec. 1, 2006

(65) Prior Publication Data

US 2008/0134006 A1 Jun. 5, 2008

(51) Int. Cl.
*G06F 11/00* (2006.01)
(52) U.S. Cl. ...................................................... 714/798
(58) Field of Classification Search ................. 714/746, 714/748, 751, 58, 798
See application file for complete search history.

(56) References Cited

U.S. PATENT DOCUMENTS 6,097,716 A * 8/2000 Abrishamkar ............... 370/342
6,606,726 B1 * 8/2003 Wilhelmsson et al. ....... 714/758
6,637,006 B1 * 10/2003 Burton ........................ 714/798

\* cited by examiner

*Primary Examiner*—Shelly A Chase
(74) *Attorney, Agent, or Firm*—Thomas, Kayden, Horstemeyer & Risley

(57) ABSTRACT

A bit error probability (BEP) estimation method includes de-shaping a coded block to obtain a channel hard output block comprising a header hard output and at least one data hard output, de-puncturing and decoding the header hard output to obtain a decoded header part, determining whether the decoded header part has errors, selecting the decoded header part or a decoded whole block as a selected part based on the determination result, wherein the decoded whole block comprises the decoded header part and a decoded data part obtained by de-puncturing and decoding the data hard output, re-encoding the selected part to obtain a re-encoded decision, and comparing the re-encoded decision to the header hard output or the channel hard output corresponding to the selected part to obtain the BEP of the coded block. A receiver employing the BEP estimation method is also provided in the invention.

24 Claims, 7 Drawing Sheets

BIT ERROR PROBABILITY ESTIMATION METHOD AND RECEIVER EMPLYING THE SAME

BACKGROUND OF THE INVENTION

1. Field of the Invention

The invention relates to communication systems and more particularly to a bit error probability (BEP) estimation method and a receiver employing the same.

2. Description of the Related Art

In radio communication systems, wireless links between base stations and their service terminals vary greatly and have a significant affect on system performance. Therefore, various technologies have emerged to handle different operating standards, such as Global System for Mobile telecommunication (GSM), General Packet Radio Service (GPRS) and the Enhanced Data rates for GSM (or Global) Evolution (EDGE) standards.

GPRS and EDGE include multiple coding/puncturing schemes and multiple modulation formats, such as Gaussian Minimum Shift Keying (GMSK) modulation or 8 Phase shift Keying (8PSK) modulation. Link adaptation (LA) is a mechanism used to adapt the channel coding and modulation schemes to the radio link conditions. LA allows the network to command the mobile set to change its modulation and coding/puncturing schemes according to the current radio condition, thereby providing qualified communication and high spectra efficiency. The actual bit error probability (BEP), changing with the variant channel, provides an accurate and timely measure representative of the change channel environment to facilitate LA. The evaluation of BEP is carried on either in the mobile set or the base station, and the estimation result is then sent back to the network for determination of the modulation format and coding/puncturing scheme by the LA mechanism.

FIGS. 1a and 1b respectively show data structure and formation procedure of a coded-block for data transmission in a transmitter of EDGE system. Referring to FIG. 1a, information bits are transmitted in a data packet DADAP in step 100 before entering the transmitter. FIG. 1b shows the data structure of the data packet DADAP. As shown, the data packet DADAP consists of a header part HP and one or two possible data parts DP. The header part HP, consisting of a header field HF and an uplink state flag (USF) field USFF, includes control and routing information associated with the data packet DADAP, for example, destination address of the data packet DADAP, error checking information, and control bits enabling receipt of the data packet DADAP to be acknowledged. The data part DP, the number of which depends on MCS type demonstrated in the header part HP, includes the information portion of the data packet DADAP. Referring to FIG. 1a, in the transmitter, USF field USFF, the header field HF and the data part DP respectively undergo steps 110, 112 and 114 to be encoded into a coded block CB conventionally referred to as a radio link control/media access control (RLC/MAC) block for data transmission.

In step 110, the USF field USFF of the header part HP is coded with a pre-coding procedure 110 to provide a coded USF field CUF. In steps 112 and 114, respectively including coding and puncturing steps 1121 and 1122, and 1141-1142, the header field HF and the data part DP are encoded and punctured to generate a coded header field CHF and a coded data part CDP respectively in order to increase reliability of the data transmission. The coded header field CHF and the coded USF field CUF are referred to as a coded header part CHP.

More specifically, in the coding steps 1121 and 1141, error correction coding or error detection coding, or both, for increased link reliability, is performed on the header field HF and the data part respectively. The coding may comprise, for example, cyclic redundancy check (CRC), convolution coding, Turbo coding, Trellis coding, block coding, or a combination thereof. As shown in FIG. 1a, the header field HF initially encoded with an outer code, e.g. particular CRC code (i.e. header check sequence) such that the CRC bits are appended to the header field HF is in sub-step $1121_1$, and then the appended header field is tailed bitten in sub-step $1121_2$, and the tailed-bitten header field is further encoded with an inner code, e.g. convolution code in sub-step $1121_3$. Similarly, in the coding step 1141, the data part DP is respectively encoded with an outer code, e.g. particular CRC code (i.e. block check sequence), tailed bitten, and encoded with an inner code (e.g. convolution code) in sub-step $1141_1$, $11411_2$, $11411_3$.

Next, the resulting bits in steps 1121 and 1141 are respectively punctured (i.e., deleted) in steps 1122 and 1142 to provide a number of unpunctured header bits (i.e. the coded header field CHF) and unpunctured data bits (i.e. the coded data part CDP). The coded header field CHF and the coded data part CDP both achieve a desired coding rate defined as the ratio of the information bits to the total bits to be transmitted. For example, the transmitter may puncture 1404 coded header/data bits to obtain 612 unpunctured header/data bits. Typically, the coded header field CHF has a lower coding rate than the coded data part CDP since the coded header field CHF contains key information of the coded block CB.

Finally, in step 116, the coded header part CHP and the coded data part CDP undergo a block shaping procedure including reordering, partitioning, and interleaving to provide the coded block CB (i.e. the RLC/MAC block) for transmission.

FIG. 2 is a flow diagram of a conventional decoding scheme used in a conventional receiver, where a reverse procedure of the coded-block formatting procedure in FIG. 1a is performed on a coded block CB' to recover the original information bits and a bit error probability (BEP) estimation method referred to as Codec method is used to obtain the BEP of the coded block CB'.

As shown, in step 216, the coded block CB' is de-shaped by a block de-shaping procedure including de-reordering, de-partitioning, and de-interleaving to provide a channel hard output CHO comprising a header hard output HHO and at least one data part DHO respectively corresponding to the coded header part CHP and the coded data part CDP in FIG. 1b.

Next, in steps 212 and 214, the header hard output HHO and the data hard output DHO are respectively depunctured and decoded to provided a decoded header part DHP and at least one decoded data part DDP respectively corresponding to the header part HP and the data part DP in FIGS. 1a and 1b.

More specifically, in steps 2122 and 2142, reverse procedures to steps 1122 and 1142 are performed. That is, the header hard output HHO and the at least one data hard output DHO are de-punctured to insert bits in positions where the bits were punctured. In the example in FIGS. 1a and 1b, the receiver de-punctures the 612 bits of the header hard output HHO/data hard output DHO to recover the original 1404 unpunctured header/data bits. Next, in steps 2121 and 2141, reverse procedures to steps 1121, 110 and 1141 are performed to decode the resulted bits in steps 2122 and 2142 into the decoded header part DHP and the at least one decoded data part DDP. The re-encoded header part RHP and the re-encoded data part DDP are designated as re-encoded whole block RWB.

To further determine whether the coded block CB' is received correctly, steps 112' and 114', respectively similar to steps 112 and 114 of FIG. 1a, are performed. In step 112', the decoded header part DHP is respectively encoded and punctured in steps 1121' and 1122', similar to steps 1121 and 1122 of FIG. 1a, to generate a re-encoded header part RHP. Similarly, in step 114', the decoded data part DDP is respectively encoded and punctured in steps 1141' and 1142', similar to steps 1141 and 1142 of FIG. 1a, to generate a re-encoded data part RDP. Next, in step 230, the channel hard output CHO and the re-encoded whole block RWB are compared to generate the BEP of the coded block CB'.

Since the header part contains key information of the coded block, if the decoded header part DHP indicates a CRC error, the receiver will be unaware of the coding and puncture type of the data hard output DHO so that the data hard output DHO cannot be correctly decoded into the decoded data part DDP. Simply deserting the corrupted coded block CB' and neglecting its contribution to the overall averaged BEP significantly degrades estimation accuracy and fails tot meet the high accuracy requirement for the EDGE systems. The Codec method is thus no longer applicable in EDGE system.

Accordingly, a BEP estimation method with high accuracy applicable to EDGE systems is called for.

BRIEF SUMMARY OF THE INVENTION

The invention discloses a BEP estimation method to estimate the BEP of a coded block to extend the traditional Codec method to a more complicated situation and result in more accurate estimation.

The invention provides a BEP estimation method to estimate the BEP of a coded block, comprising de-shaping the coded block to obtain a channel hard output block comprising a header hard output and at least one data hard output, de-puncturing and decoding the header hard output to obtain a decoded header part, analyzing whether the decoded header part has errors, selecting the decoded header part or a decoded whole block as a selected part based on the analysis result, wherein the decoded whole block comprises the decoded header part and a decoded data part obtained by de-puncturing and decoding the data hard output, re-encoding the selected part to obtain a re-encoded decision, and comparing the re-encoded decision to the header hard output or the channel hard output corresponding to the selected part to obtain the BEP of the coded block.

If the decoded header part has errors, the BEP of the coded block can be replaced with the BEP of the hard header output. When the decoded header part has no errors but the decoded header part is wrong, the decoded header part can be re-encoded alone or the decoded whole block comprising the decoded header part and the decoded data part can be re-encoded to obtain the BEP of the coded block. When none of the decoded header or data parts has errors, the decoded whole block can be re-encoded to provide the BEP of the coded block.

Two different methods may be used to calculate the block BEP when the decoded whole block is selected as the selected part and is thus re-encoded to obtain the re-encoded decision, which is sequentially compared with the channel hard output to calculate the block BEP. In one, the channel hard output is compared to the re-encoded whole block to obtain the BEP of the coded block. In the other, the BEP of the coded block is a weighted sum of a header BEP and a data BEP, wherein the header BEP and the data BEP are respectively obtained by respectively comparing the header hard output and the data hard output of the channel hard output to the re-encoded header part and the re-encoded data part RDP of the re-encoded whole block.

The invention also provides a receiver receiving a coded block and estimating bit error probability (BEP) thereof. The receiver comprises a de-shaping module de-shaping the coded block to obtain a channel hard output block comprising a header hard output and at least one data hard output, a first de-puncturing/decoding module de-puncturing and decoding the header hard output to obtain a decoded header part, a determination module determining whether the decoded header part has errors, a selecting module selecting the decoded header part or a decoded whole block as a selected part based on the determination result, wherein the selecting module comprises a second de-puncturing/decoding module de-puncturing and decoding the data hard output to a decoded data part, and the decoded whole block comprises the decoded header part and the decoded data part, a re-encoding module re-encoding the selected part to obtain a re-encoded decision, and a BEP calculation module comparing the re-encoded decision to the header hard output or the channel hard output corresponding to the selected part to obtain the BEP of the coded block.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 2:
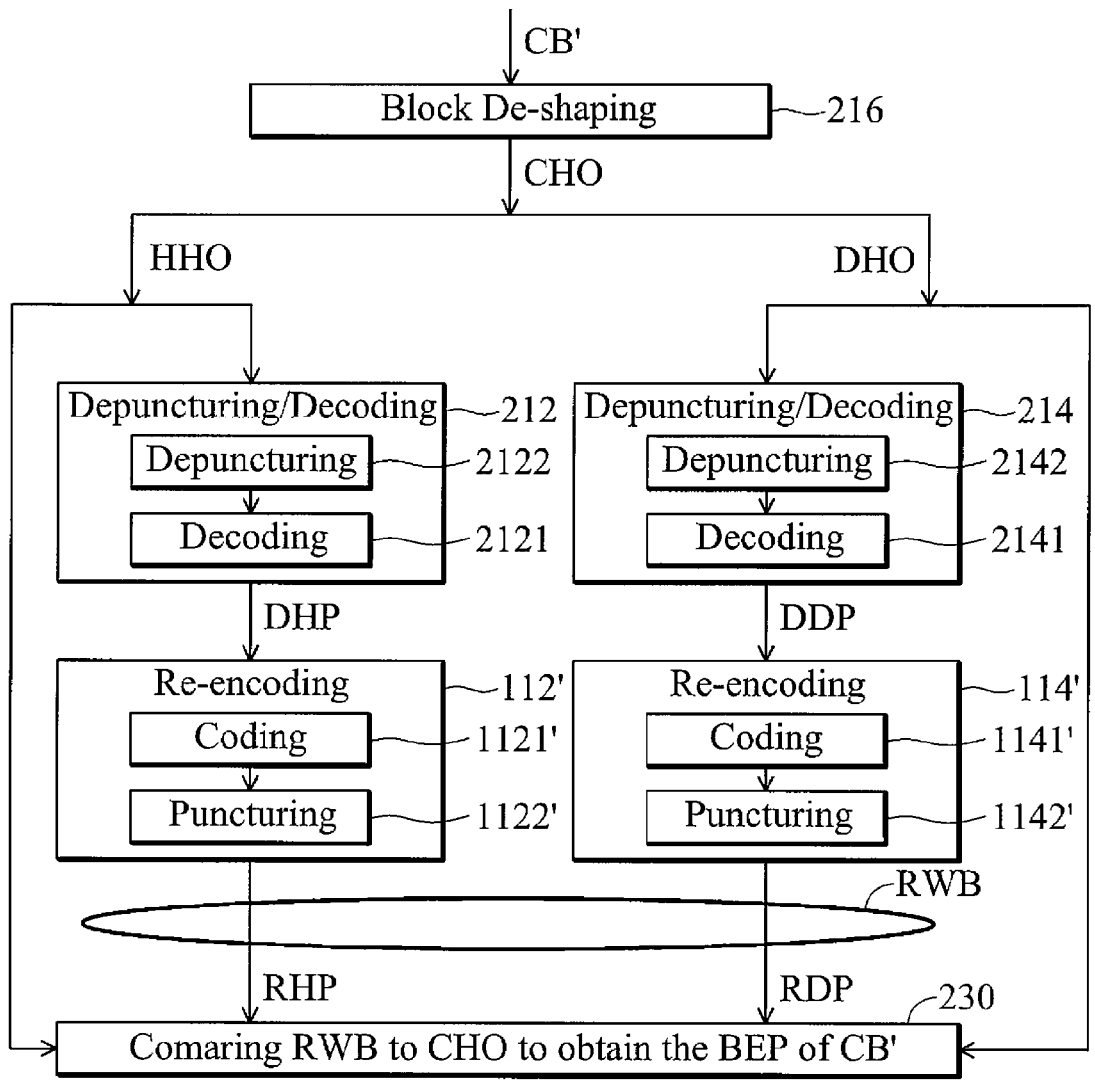
FIG. 2 is a flow diagram of a conventional decoding scheme used in a conventional receiver.

In the following embodiments of the invention, whether the decoded data part DDP is taken into account in block BEP calculation is mainly dependent on whether the decoded header part DHP has errors, unlike simultaneous encoding, de-puncturing and en-conding of the decoded header and data parts in FIG. 2. The header BEP can replace the block BEP since the coding rate of the header part is comparably low and the header part DHP is thus the most reliable part of the coded block CB'.

Figure 3:
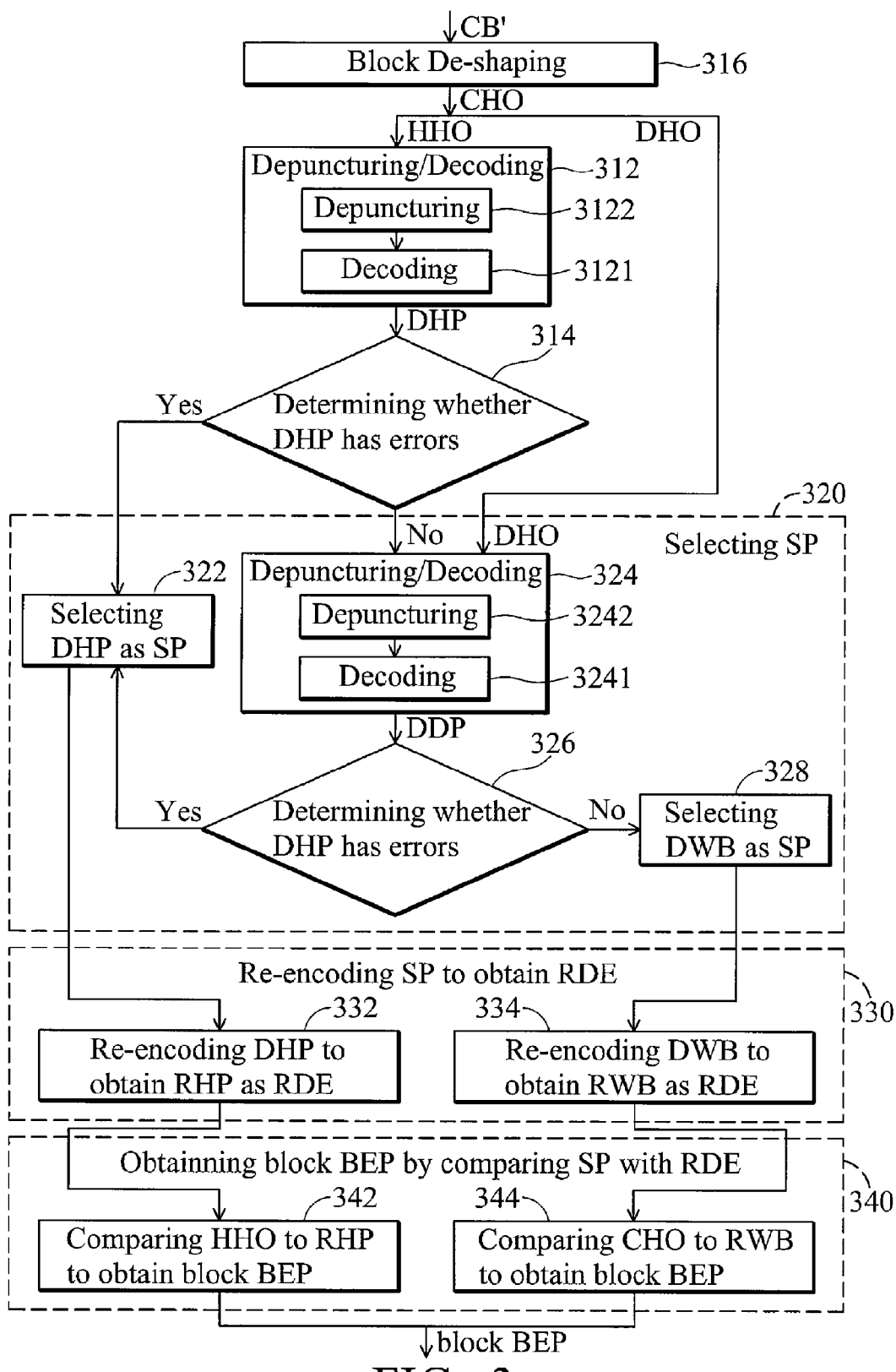
FIG. 3 is a flow diagram of a bit error probability estimation method in accordance with a first embodiment of the invention.

FIG. 3 is a flow diagram of a bit error probability (BEP) estimation method in accordance with a first embodiment of the invention. In step 316, a coded block CB' is de-shaped by a block de-shaping procedure including de-reordering, de-partitioning, and de-interleaving to provide a channel hard output CHO comprising a header hard output HHO and at least one data part DHO.

Next, in step 312, comprising steps 3122 and 3121, the header hard output HHO is de-punctured in step 3122 to insert bits in positions where the bits were punctured and is then decoded in step 3121 into a decoded header part DHP.

Figure 1A:
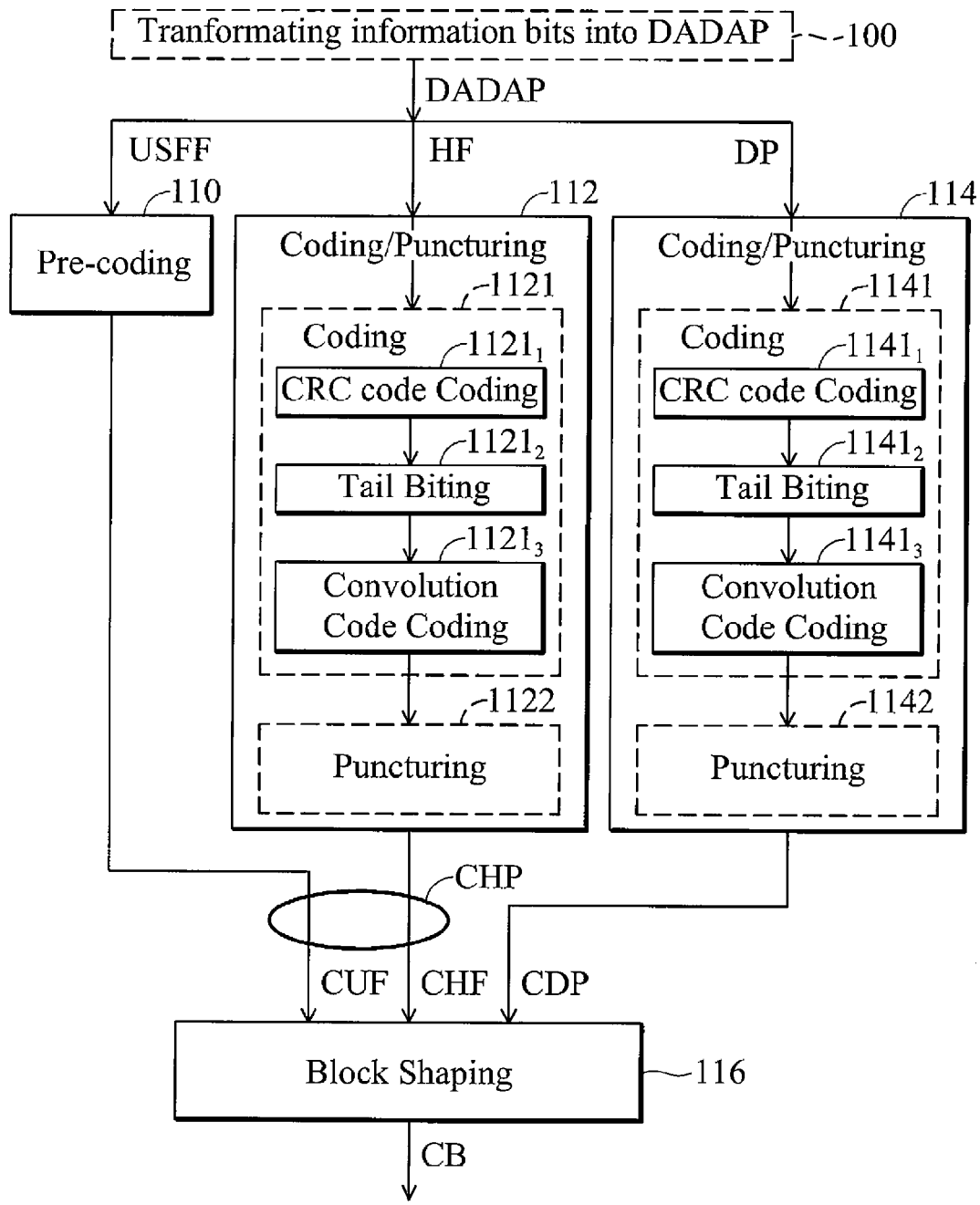
FIGS. 1a and 1b respectively show data structure and formation procedure of a coded block for data transmission in a transmitter of EDGE system.
Figure 1B:
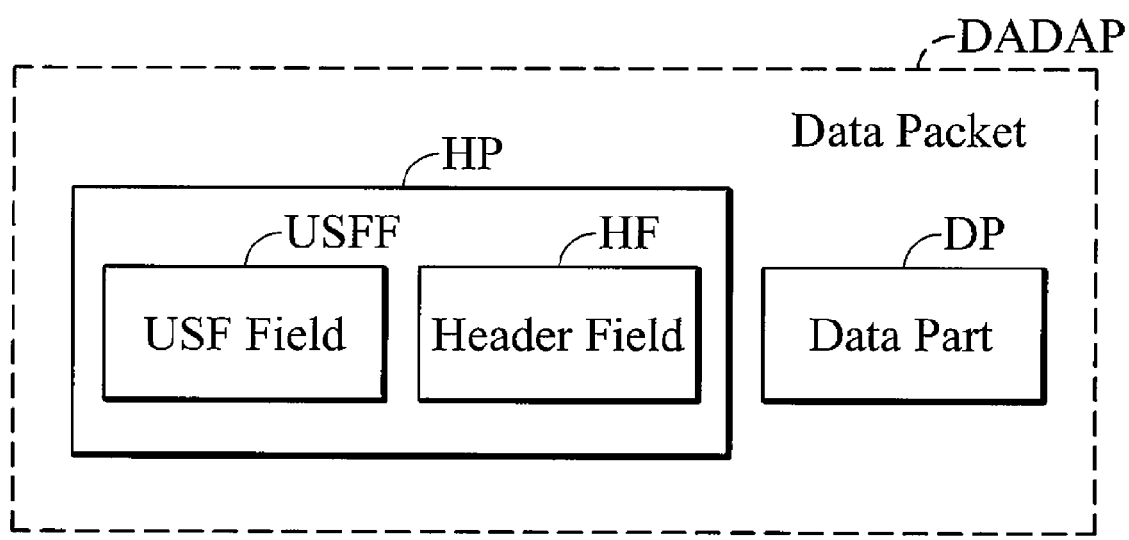

Next, in step 314, it is determined whether the decoded header part DHP has errors. The analysis is dependent on the error correction/detection coding performed on the header field in the transformer. For example, in the embodiment corresponding to FIG. 1a, it is determined whether the decoded header part DHP has CRC errors.

Next, step 320, comprising steps 322, 324 and 326, is performed to select the decoded header part DHP or a decoded whole block DWB consisting of the decoded header part DHP and a decoded data part DDP as a selected part SP based on the analysis result. If the decoded header part DHP has errors (Yes), step 322 is performed to select decoded header part DHP as the selected part SP. Otherwise (No), steps 324 and 326 are sequentially performed.

In step 324, comprising steps 3242 and 3241, respectively similar to steps 2142 and 2141, the at least one data hard output DHO is respectively de-punctured in step 3142 to insert bits in positions where the bits were punctured and then is decoded into at least one decoded data part DDP.

Next, in sub-step 326, it is determined whether at least one of the at least one decoded data part DDP has errors. The analysis is dependent on the error correction/detection coding performed on the data part in the transformer. For example, in the embodiment corresponding to FIG. 1a, it is determined whether the decoded data part DDP has CRC errors. If at least one of the at least one the decoded data part DDP has errors (Yes), step 322 is also performed to select the decoded header part DHP as the selected part SP. Otherwise (No), step 328 is performed to generate a decoded whole block DWB consisting of the decoded header part DHP and the at least one decoded data part DDP as a selected part SP.

Next, in step 330, a re-encoding procedure comprising coding and puncturing respectively similar to steps 1121 and 1122 is performed on the selected part SP to obtain a re-encoded decision RDE. More specifically, if the decoded header part DHP is selected as the selected part SP, the decoded header part DHP is re-encoded to obtain a re-encoded header part RHP as the re-encoded decision RDE (step 332), with similar procedure in step 112' of FIG. 2. If the decoded whole block DWB is selected as the selected part SP, the decoded whole block DWB is re-encoded to obtain a re-encoded whole block RWB as the re-encoded decision RDE (step 334). The step 334 comprises re-encoding the decoded data part(s) DDP into a re-encoded-data part(s) RDP with similar procedure to step 114' of FIG. 2, thereby obtaining the re-encoded whole block RWB consisting of the re-encoded header part RHP and the re-encoded-data part(s) RDP as the re-encoded decision RDE.

Next, step 340, comprising steps 342 and 344, is sequentially performed by comparing the channel hard output CHO or the header hard output HHO obtained in step 316 corresponding to the selected part SP with the re-encoded decision RDE to obtain the BEP of the coded block CB' (hereafter referred as "block BEP"). More specifically, in step 342 following step 332, the BEP of the header hard output HHO (hereafter referred as "header BEP") is obtained as the block BEP by comparing the header hard output HHO with the re-encoded header part RHP; in step 342 following step 334, the block BEP is obtained by comparing the channel hard output CHO to the re-encoded whole block RWB.

It is noted that, in step 344, two different calculation methods may be used to obtain the block BEP. In one, the channel hard output CHO is compared to the re-encoded whole block RWB to obtain the block BEP, as described in the conventional Codec method of FIG. 2. In the other, the header hard output HHO and the data hard output DHO in the channel hard output CHO are respectively compared to the re-encoded header part RHP and the re-encoded data part(s) RDP of the re-encoded whole block RWB to obtain the BEP of the hard header output HHO (i.e. header BEP) and the BEP of the hard data output (hereafter referred to as "data BEP"). It is noted that if there is more than one decoded data part DDP, then the data BEP is a sum of the BEP of decoded data parts DDP. The block BEP is a weighted sum of the header BEP and data BEP, that is, $BEP_B = \omega_1 \cdot BEP_H + \omega_2 \cdot BEP_D$, where $BEP_B$, $BEP_H$ and $BEP_D$ respectively denote the block BEP, the header BEP and the data BEP.

Table 1 summarizes the decisions in sub-step 316 of FIG. 3 corresponding to four cases having different combinations of CRC errors of the decoded header part DHP and decoded data part DDP. Entry="0" indicates that the part is CRC error free. Entry="1" indicates errors exist in the part. Entry="Yes" indicates the part is taken into account in the block BEP calculation. Entry="No" indicates the part is not taken into account in the block BEP calculation. As shown, when neither the decoded data nor header parts DHP and DDP have CRC errors (case 1), both the decoded data and header parts DHP and DDP will be considered in the block BEP calculation. When at least one of the decoded data or header parts has CRC errors (case 2, 3, and 4), only the decoded header part DHP is re-encoded and considered in the block BEP calculation.

TABLE 1

| Case | Header RC | Data CRC | Header | Data |
|---|---|---|---|---|
| 1 | 0 | 0 | Yes | Yes |
| 2 | 0 | 1 | Yes | No |
| 3 | 1 | 0 | Yes | No |
| 4 | 1 | 1 | Yes | No |

Figure 4:
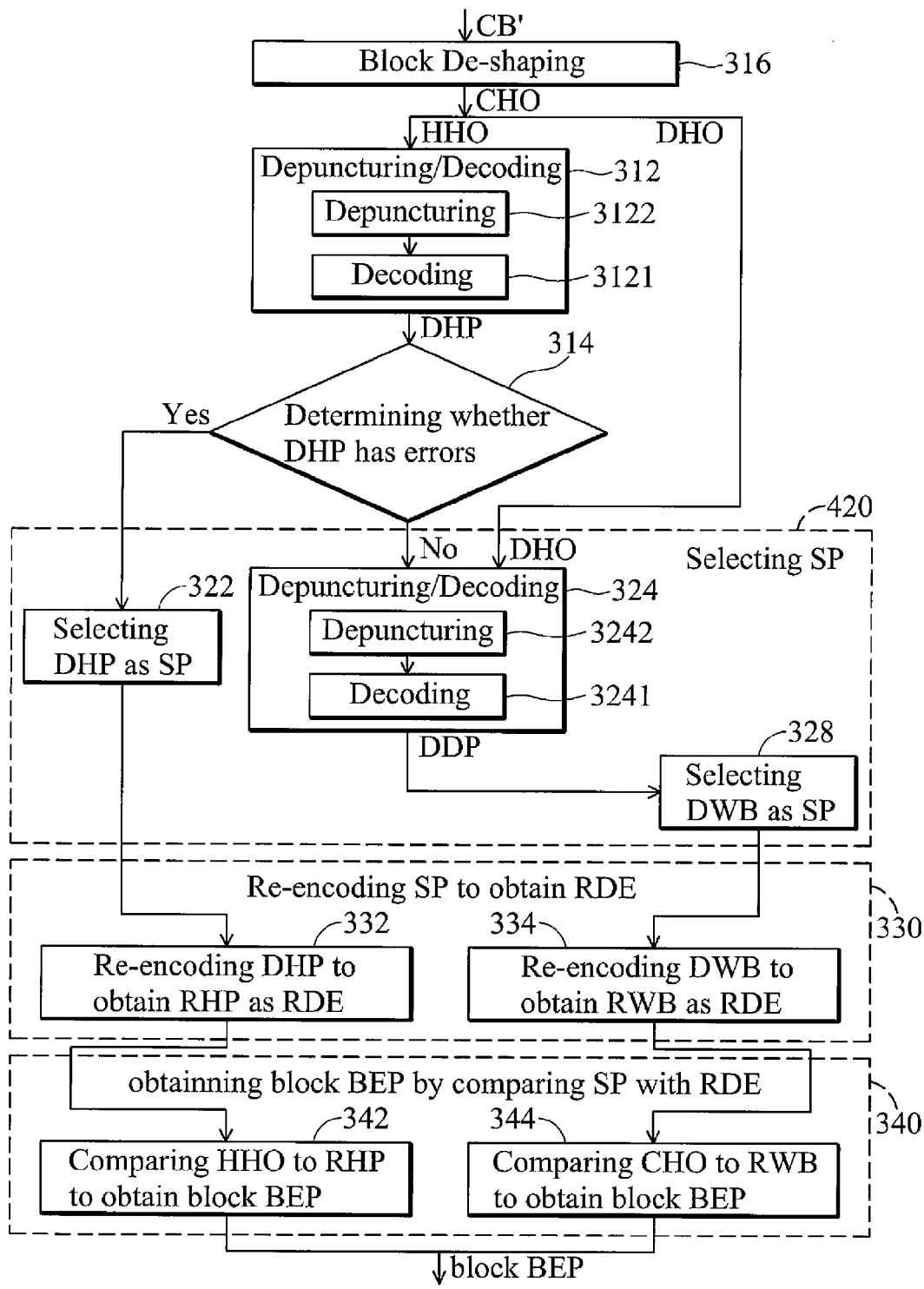
FIG. 4 is a flow diagram of a bit error probability estimation method in accordance with a second embodiment of the invention.

FIG. 4 is a flow diagram of a bit error probability (BEP) estimation method in accordance with a second embodiment of the invention, differing from FIG. 3 only in that step 320 is replaced by step 420 in which step 326 is removed, that is, step 328 is performed after step 324 without determining whether DDP has errors. Accordingly, in step 328, the decoded whole block DWB, consisting of the decoded header part DHP and the at least one decoded data part DDP, is selected as a selected part SP regardless of whether the decoded data part DDP obtained by step 324 has CRC errors or not. The other parts of the figure are similar to FIG. 3 and are thus not repeated here for brevity.

Table 2 summarizes the decisions in sub-step 416 of FIG. 4 corresponding to four cases having different combinations of CRC errors of the decoded header and data part. Similar to Table. 1, Entry="0" indicates that the part is CRC error free. Entry="1" indicates errors exist in the part. Entry="Yes" indicates the part is taken into account in the BEP calculation. Entry="No" indicates the part is not taken into account in the BEP calculation. As shown, Table. 2 differs from Table. 1 in only case 2 where both of the decoded header and data parts DHP and DDP rather than only the decoded header part DHP are taken into account in the block BEP calculation. More specifically, when neither the decoded header nor data parts DHP and DDP have CRC errors (case 1) or the decoded header part DHP does not have CRC errors and the decoded data part DDP has CRC errors (case 2), both the decoded header and data parts DHP and DDP will be re-encoded and considered in the block BEP calculation. When the decoded header part DHP has CRC errors and the decoded data part DDP does not have CRC errors (case 3) or both the decoded data and header parts DHP and DDP have CRC errors (case 4), only the decoded header part DHP is re-encoded and considered in the block BEP calculation.

TABLE 2

| Case | Header RC | Data CRC | Header | Data |
|---|---|---|---|---|
| 1 | 0 | 0 | Yes | Yes |
| 2 | 0 | 1 | Yes | No |
| 3 | 1 | 0 | Yes | No |
| 4 | 1 | 1 | Yes | No |

Figure 5:
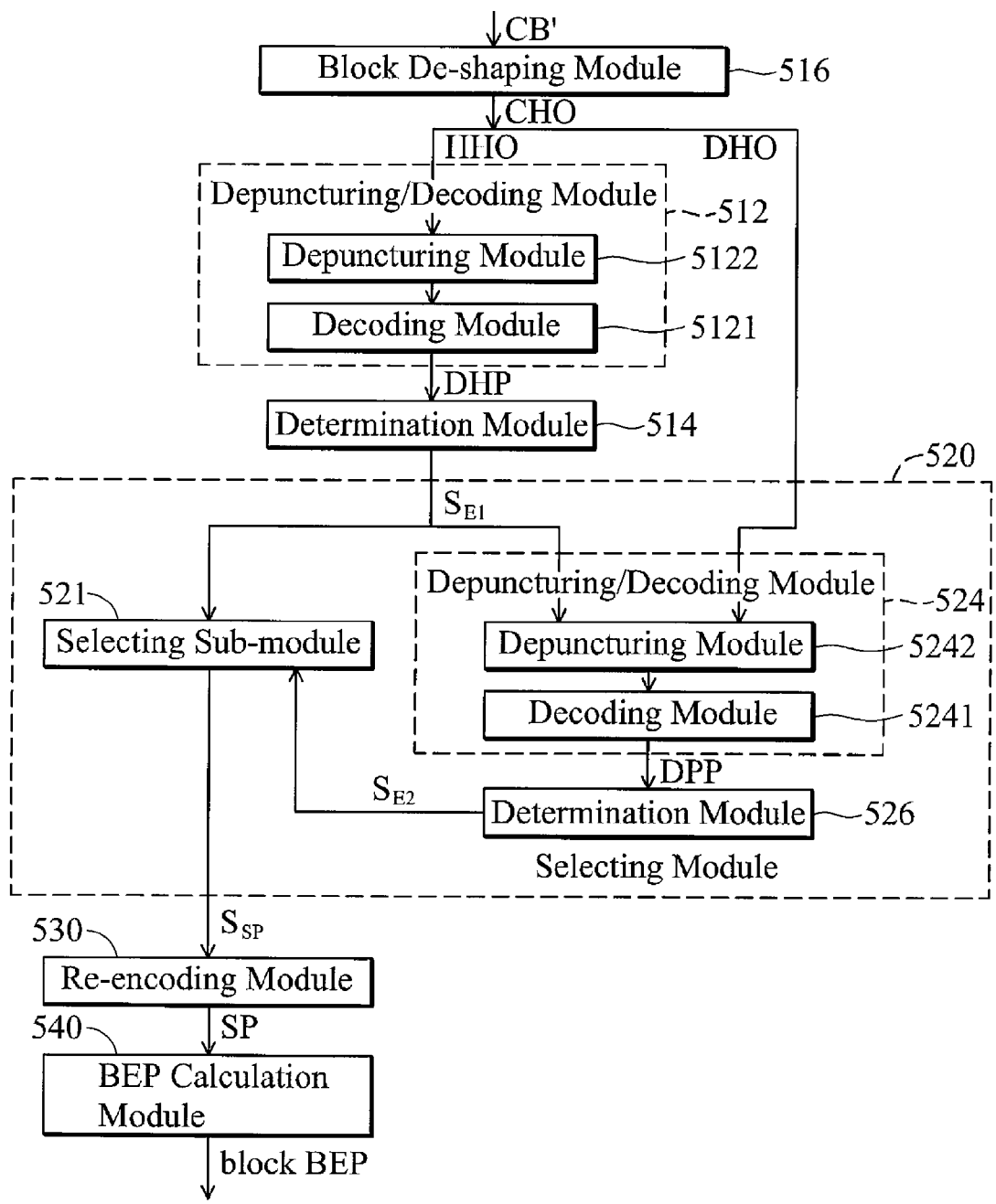
FIG. 5 is a block diagram of a receiver in accordance with a first embodiment of the invention.

FIG. 5 is a block diagram of a receiver 500 employing the BEP estimation method of FIG. 3 in accordance with a first embodiment of the invention. As shown, the receiver 500 comprises a block de-shaping module 516, a depuncturing/deconding module 512 comprising a depuncturing sub-module 5122 and a decoding sub-module 5121, a selecting module 520, a re-encoding module 530 and, a BEP calculation module 540.

The block de-shaping module 516 de-shapes a coded block CB' to provide a channel hard output CHO comprising a header hard output HHO and at least one data part DHO. In an embodiment, the block de-shaping module 502 comprises de-reordering, de-partitioning, and de-interleaving modules. In other words, the block de-shaping module 502 performs step 316 of FIG. 3.

The depuncturing sub-module 5122 then receives and depunctures the header hard output HHO to insert bits in positions where the bits were punctured. The decoding sub-module 5121 sequentially decodes the depunctured result of the depuncturing module 5122 into a decoded header part DHP. In other words, the depuncturing sub-module 5122 and the decoding sub-module 5121 perform steps 3122 and 3121 of FIG. 3, respectively.

Next, the determination module 514 determines whether the decoded header part DHP has errors and outputs a first error signal $S_{E1}$ corresponding to the determination result. The analysis is dependent on the error correction/detection coding performed on the header field in the transformer. For example, in the embodiment corresponding to FIG. 1a, the determination module 514 determines whether the decoded header part DHP has CRC errors. Corresponding to FIG. 3, the determination module 514 performs step 314.

Next, a selecting module 520 selects a selected part SP according to the first error signal $S_{E1}$ provided by the determination module 514. As shown, the selecting module 520 comprises a selecting sub-module 521, a depuncturing/decoding module 526 and a determination module 526. The first error signal $S_{E1}$ is sent to both the selecting sub-module 521 and the depuncturing/decoding module 526. If the first error signal $S_{E1}$ indicates that the decoded header part DHP has errors, the selecting sub-module 521 selects the decoded header part DHP as the selected part SP and outputs a selected part signal $S_{SP}$ representing the selected part SP. Otherwise, the first error signal $S_{E1}$ activates depuncturing sub-module 5242 within a depuncturing/decoding module 524.

The depuncturing sub-module 5242, similar to the depuncturing sub-module 5122, depunctures at least one data hard output DHO to insert bits in positions where the bits were punctured. The decoding sub-module 5241, similar to the decoding sub-module 5242, decodes the de-punctured result of the depuncturing sub-module 5242 into at least one decoded data part DDP. Next, the determination module 526 determines whether at least one of the at least one decoded data part DDP has errors and outputs a second error signal $S_{E2}$ representative of the determination result to the selecting sub-module 521. The determination process is dependent on the error correction/detection coding performed on the data part in the transformer. For example, in the embodiment corresponding to FIG. 1a, the determination module 526 determines whether the decoded data part DDP has CRC errors. If the second error signal $S_{E2}$ indicates that at least one of the at least one the decoded data part DDP has errors, the selecting sub-module 521 also selects the decoded header part DHP as the selected part SP and outputs the selected part signal $S_{SP}$ representing the selected part SP. Otherwise, the selecting sub-module 521 selects a decoded whole block DWB as the selected part SP and outputs the selected part signal $S_{SP}$ representing the selected part SP, wherein the decoded whole block DWB consists of the decoded header part DHP and the at least one decoded data part DDP. Corresponding to FIG. 3, the selecting module 520 performs step 320.

After receiving the selected part signal $S_{SP}$, the re-encoding module 530 performs coding and puncturing procedures respectively similar to steps 1121 and 1122 on the selected part SP to obtain a re-encoded decision RDE. More specifically, if the decoded header part DHP is selected as the selected part SP in the selecting module 520, the re-encoding module 530 re-encodes the decoded header part DHP to obtain a re-encoded header part RHP as the re-encoded decision RDE, with similar procedure described in step 112' of FIG. 2; and if the decoded whole block DWB is selected as the selected part SP, the re-encoding module 530 re-encodes the decoded whole block DWB to obtain a re-encoded whole block RWB as the re-encoded decision RDE. The re-encoding module 530 re-encodes the decoded data part(s) DDP into a re-encoded-data part(s) RDP with similar procedure to step 114' of FIG. 2, thereby obtaining the re-encoded whole block RWB consisting of the re-encoded header part RHP and the re-encoded-data part(s) RDP as the re-encoded decision RDE. Corresponding to FIG. 3, the re-encoding module 530 performs step 330.

Next, the BEP calculation module 540 compares the channel hard output CHO or the header hard output HHO generated by the block de-shaping module 516 corresponding to the selected part SP with the re-encoded decision RDE to obtain the BEP of the coded block CB' (or the "block BEP"). More specifically, if the decoded header part DHP is re-encoded in the re-encoding module 330, then the BEP calculation module 540 obtains the BEP of the header hard output HHO (or the "header BEP") as the block BEP by comparing the header hard output HHO with the re-encoded header part RHP. Otherwise, if decoded whole block DWB is re-encoded in the re-encoding module 330, then the BEP calculation module 540 obtains the block BEP by comparing the channel hard output CHO to the re-encoded whole block RWB. In other words, step 340 is performed in the BEP calculation module 540. The calculation methods to obtain the block BEP are detailed in descriptions of step 340 of FIG. 3 and thus omitted here for brevity.

Figure 6:
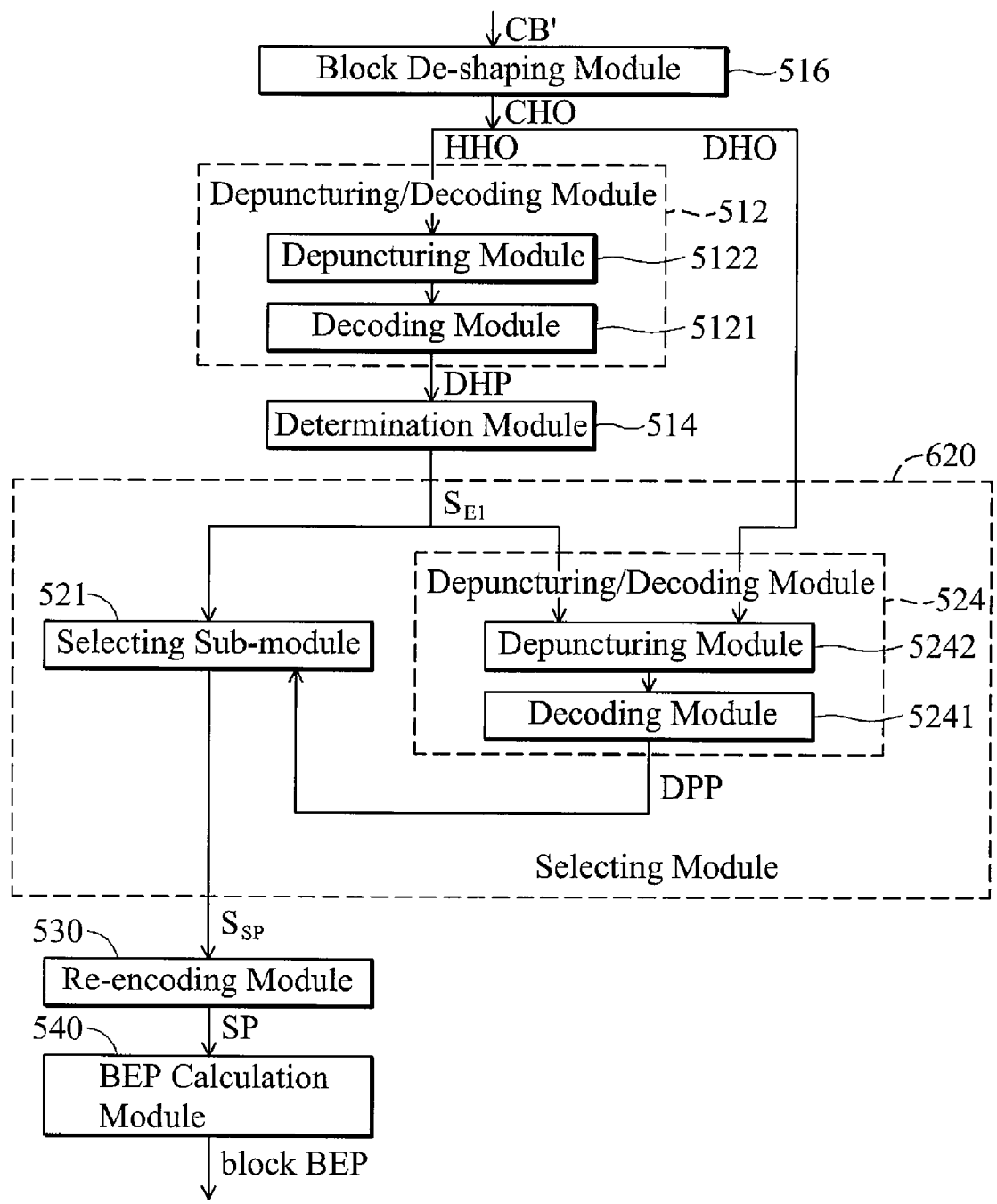
FIG. 6 is a block diagram of a receiver in accordance with a second embodiment of the invention.

FIG. 6 is a block diagram of a receiver 600 employing the BEP estimation method of FIG. 4 in accordance with a second embodiment of the invention, differing from FIG. 5 only in that the selecting module 520 is replaced by another selecting module 620 to perform step 420 of FIG. 4 where the determination module 526 is removed. After the depuncturing/decoding module 524 finished depuncturing/decoding the DHO, the selecting sub-module 521 selects the decoded whole block DWB as the selected part SP. Accordingly, the decoded whole block DWB, consisting of the decoded header part DHP and the at least one decoded data part DDP, is selected as a selected part SP regardless of whether the decoded data part DDP obtained by the depuncturing/decoding module 524 has CRC errors or not. The other parts of the figure are similar to FIG. 3 and are thus not repeated here for brevity.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A bit error probability (BEP) estimation method to estimate BEP of a coded block, comprising:
    de-shaping the coded block to obtain a channel hard output block comprising a header hard output and at least one data hard output;
    de-puncturing and decoding the header hard output to obtain a decoded header part;
    determining whether the decoded header part has errors;
    selecting the decoded header part or a decoded whole block as a selected part based on the determination result, wherein the decoded whole block comprises the decoded header part and a decoded data part obtained by de-puncturing and decoding the data hard output;
    re-encoding the selected part to obtain a re-encoded decision; and
    comparing the re-encoded decision to the header hard output or the channel hard output corresponding to the selected part to obtain the BEP of the coded block.

2. The BEP estimation method of claim 1, wherein determination of whether the decoded head part has errors comprises determining whether the decoded header part has cyclic redundancy check errors.

3. The BEP estimation method of claim 1, wherein selection of the decoded header part or the decoded whole block as a selected part based on the determination result comprises selecting the header hard output as the selected part when the decoded header part has errors.

4. The BEP estimation method of claim 1, wherein selection of the decoded header part or the decoded whole block as a selected part based on the analysis result comprises, when the decoded header part has no errors:
    de-puncturing and decoding the data hard output to obtain the decoded data part;
    determining whether the decoded data part has errors; and
    selecting the decoded header part or the decoded whole block as the selected part based on the determination result.

5. The BEP estimation method of claim 4, wherein determination of whether the decoded data part has errors comprises determining whether the decoded data part has cyclic redundancy check errors.

6. The BEP estimation method of claim 4, wherein determination of whether the decoded data part has errors comprises selecting the decoded whole block as the selected part when the decoded data part has no errors.

7. The BEP estimation method of claim 4, wherein determination of whether the decoded data part has errors comprises selecting the decoded header part as the selected part when the decoded data part has errors.

8. The BEP estimation method of claim 4, wherein analyzing whether the decoded data part has errors comprises selecting the decoded whole block as the selected part when the decoded data part has errors.

9. The BEP estimation method of claim 6, wherein the re-encoded decision comprises a re-encoded header part and a re-encoded data part respectively corresponding to the decoded header part and the decoded data part; and comparing the re-encoded decision to the header hard output or the channel hard output corresponding to the selected part to obtain the BEP of the coded block:
    comparing the re-encoded head part to the header hard output to obtain a header BEP;
    comparing the re-encoded data part to the data hard output to obtain a data BEP; and
    obtaining the BEP of the coded block according to the header BEP and data BEP.

10. The BEP estimation method of claim 8, wherein the re-encoded decision comprises a re-encoded header part and a re-encoded data part respectively corresponding to the decoded header part and the decoded data part; and wherein comparison of the re-encoded decision to the header hard output or the channel hard output corresponding to the selected part to obtain the BEP of the coded block comprises:
    comparing the re-encoded head part and the header hard output to obtain a header BEP;
    comparing the re-encoded data part and the data hard output to obtain a data BEP; and
    obtaining the BEP of the coded block according to the header BEP and data BEP.

11. The BEP estimation method of claim 9, wherein the BEP of the coded block is a weighted sum of the header BEP and the data BEP.

12. The BEP estimation method of claim 10, wherein the BEP of the radio block is a weighted sum of the header BEP and the data BEP.

13. A receiver receiving a coded block and estimating bit error probability (BEP) thereof, comprising:
    a de-shaping module de-shaping the coded block to obtain a channel hard output block comprising a header hard output and at least one data hard output;
    a first de-puncturing/decoding module de-puncturing and decoding the header hard output to obtain a decoded header part;
    a determination module determining whether the decoded header part has errors;
    a selecting module selecting the decoded header part or a decoded whole block as a selected part based on the determination result, wherein the selecting module comprises a second de-puncturing/decoding module de-puncturing and decoding the data hard output to a decoded data part, and the decoded whole block comprises the decoded header part and the decoded data part;
    a re-encoding module re-encoding the selected part to obtain a re-encoded decision; and
    a BEP calculation module comparing the re-encoded decision to the header hard output or the channel hard output corresponding to the selected part to obtain the BEP of the coded block.

14. The receiver of claim 13, wherein in determination of whether the decoded header part has errors, the determination module determines whether the decoded header part has cyclic redundancy check errors.

15. The receiver of claim 13, wherein in selection of the decoded header part or the decoded whole block as a selected part based on the determination result, the selecting module selects the header hard output as the selected part when the decoded header part has errors.

16. The receiver of claim 13, wherein in selection of the decoded header part or the decoded whole block as a selected part based on the analysis result, when the decoded header part has no errors, the selecting module de-punctures and decodes the data hard output to obtain the decoded data part, determines whether the decoded data part has errors, and selects the decoded header part or the decoded whole block as the selected part based on the determination result.

17. The receiver of claim 16, wherein in determination of whether the decoded data part has errors, the selecting module determines whether the decoded data part has cyclic redundancy check errors.

18. The receiver of claim 16, wherein in determination of whether the decoded data part has errors, the selecting module selects the decoded whole block as the selected part when the decoded data part has no errors.

19. The receiver estimation method of claim 16, wherein in determination of whether the decoded data part has errors, the selecting module selects the decoded header part as the selected part when the decoded data part has errors.

20. The receiver of claim 16, wherein in analysis of whether the decoded data part has errors, the selecting module selects the decoded whole block as the selected part when the decoded data part has errors.

21. The receiver of claim 18, wherein the re-encoded decision comprises a re-encoded header part and a re-encoded data part respectively corresponding to the decoded header part and the decoded data part; and wherein in comparison of the re-encoded decision to the header hard output or the channel hard output corresponding to the selected part to obtain the BEP of the coded block, the BEP calculation module compares the re-encoded head part to the header hard output to obtain a header BEP, compares the re-encoded data part to the data hard output to obtain a data BEP, and obtains the BEP of the coded block according to the header BEP and data BEP.

22. The receiver of claim 20, wherein the re-encoded decision comprises a re-encoded header part and a re-encoded data part respectively corresponding to the decoded header part and the decoded data part; and in comparison of the re-encoded decision to the header hard output or the channel hard output corresponding to the selected part to obtain the BEP of the coded block, the BEP calculation module compares the re-encoded head part and the header hard output to obtain a header BEP, compares the re-encoded data part and the data hard output to obtain a data BEP, and obtains the BEP of the coded block according to the header BEP and data BEP.

23. The receiver of claim 21, wherein the BEP of the coded block is a weighted sum of the header BEP and the data BEP.

24. The receiver of claim 22, wherein the BEP of the radio block is a weighted sum of the header BEP and the data BEP.

* * * * *